(12) United States Patent
Farooqi et al.

(10) Patent No.: US 7,692,568 B2
(45) Date of Patent: Apr. 6, 2010

(54) LOW POWER SIGMA DELTA MODULATOR WITH SUCCESSIVE APPROXIMATION CONVERTER

(75) Inventors: Neaz Farooqi, Colorado Springs, CO (US); Jerry Wahl, Woodland Park, CO (US); Garry Richardson, Colorado Springs, CO (US)

(73) Assignee: AMI Semiconductor, Inc., Pocatello, ID (US)

( * ) Notice: Subject to any disclaimer, the term of this patent is extended or adjusted under 35 U.S.C. 154(b) by 0 days.

(21) Appl. No.: 11/561,828

(22) Filed: Nov. 20, 2006

(65) Prior Publication Data

US 2007/0252736 A1    Nov. 1, 2007

Related U.S. Application Data

(63) Continuation of application No. 11/132,705, filed on May 19, 2005, now Pat. No. 7,142,144.

(51) Int. Cl.
*H03M 3/00* (2006.01)

(52) U.S. Cl. .................................. 341/143; 341/155

(58) Field of Classification Search .......... 341/143–155
See application file for complete search history.

(56) References Cited

U.S. PATENT DOCUMENTS

| 4,187,413 | A |   | 2/1980  | Moser         |         |
|-----------|---|---|---------|---------------|---------|
| 5,408,235 | A | * | 4/1995  | Doyle et al.  | 341/143 |
| 5,578,935 | A | * | 11/1996 | Burns         | 324/763 |
| 5,633,937 | A |   | 5/1997  | Ribic         |         |
| 5,648,779 | A | * | 7/1997  | Cabler        | 341/143 |
| 5,654,711 | A | * | 8/1997  | Fujimori      | 341/143 |
| 5,936,562 | A | * | 8/1999  | Brooks et al. | 341/143 |
| 5,982,313 | A | * | 11/1999 | Brooks et al. | 341/143 |
| 6,111,531 | A |   | 8/2000  | Farag         |         |
| 6,147,633 | A |   | 11/2000 | Ukawa et al.  |         |
| 6,181,740 | B1 |  | 1/2001  | Yasuda        |         |
| 6,567,021 | B1 | * | 5/2003 | Burns         | 341/120 |
| 6,577,258 | B2 |  | 6/2003  | Ruha et al.   |         |
| 6,603,418 | B2 | * | 8/2003 | Al-Awadhi     | 341/144 |

(Continued)

FOREIGN PATENT DOCUMENTS

DE    10351384 A1 *  6/2005    ................. 341/143

OTHER PUBLICATIONS

Ball, Stuart, "Analog-to-Digital Converters", http://www.embedded.com/story/OEG20010418S0038, (May 1, 2001), 1-12.

(Continued)

*Primary Examiner*—Lam T Mai
(74) *Attorney, Agent, or Firm*—Schwegman, Lundberg & Woessner, P.A.

(57) ABSTRACT

A low power analog-to-digital channel includes a decimation filter coupled to a sigma-delta modulator. Various embodiments include a decimation filter including an output and a sigma-delta modulator coupled to the output of the decimation filter, where a clock frequency applied to the decimation filter is approximately a integral multiple of a sampling frequency of the sigma delta modulator. In an embodiment, the sigma-delta modulator includes one or more successive approximation converters. In an embodiment, the sigma delta modulator includes one or more area efficient integrators.

28 Claims, 5 Drawing Sheets

U.S. PATENT DOCUMENTS

| | | | |
|---|---|---|---|
| 6,674,381 B1 | 1/2004 | Gomez et al. | |
| 6,812,874 B1 | 11/2004 | Johnson | |
| 6,816,097 B2 * | 11/2004 | Brooks et al. | 341/143 |
| 6,844,840 B1 * | 1/2005 | Melanson | 341/161 |
| 6,873,276 B2 * | 3/2005 | Yang et al. | 341/143 |
| 6,888,331 B2 | 5/2005 | Morales | |
| 6,920,182 B2 | 7/2005 | Bolton, Jr. | |
| 6,931,241 B2 * | 8/2005 | Khlat et al. | 455/137 |
| 6,950,049 B2 | 9/2005 | Brooks et al. | |
| 6,956,517 B1 * | 10/2005 | Baker et al. | 341/155 |
| 6,965,339 B2 * | 11/2005 | Midya et al. | 341/163 |
| 7,142,144 B1 * | 11/2006 | Farooqi et al. | 341/143 |
| 7,180,432 B2 * | 2/2007 | Oliaei | 341/143 |
| 7,212,137 B2 * | 5/2007 | Melanson | 341/77 |
| 2002/0106091 A1 | 8/2002 | Furst et al. | |
| 2004/0156520 A1 | 8/2004 | Poulsen et al. | |
| 2006/0261989 A1 | 11/2006 | Farooqi et al. | |

OTHER PUBLICATIONS

Calvert, J B., "Switched Capacitors and Filters: The 7660 and the MF10", http://www.du.edu/~etuttle/electron/elect14.htm, (Jul. 28, 2001),1-3.

Dallas Semiconductor Maxim, "Demystifying Sigma-Delta ADCs", *Application Note 1870:*, http://www.maxim-ic.com/appnotes.cfm/appnote_number/1870,(Jan. 31, 2003),1-15.

Dallas Semiconductor Maxim, "The Basics of Anti-Aliasing: Using Switched-Capacitor Filters", *App 3494*, http://www.maxim-ic.com/appnotes.cfm/appnote_number/3494/ln/en,(Mar. 4, 2005),1-7.

Grebene, Alan B., et al., *In Bipolar and MOS analog integrated circuit design*, (1984),pp. 847-855.

Lyons, R G., "Understanding Digital Signal Processing", *Addison Wesley Longman Inc.*, http://www.dspguru.com/info/terms/filtterm/index2.htm,(1997),Appendix F—pp. 494-505.

Nagaraj, K , "A parasitic-insensitive area-efficient approach to realizing very large time constants in switched-capacitor circuits", *IEEE Transactions on Circuits and Systems*, 36(9), (Sep. 1989),1210-1216.

Park, Sangil , "Principles of Sigma-Delta Modulation for Analog-to-Digital Converters", *Motorola Inc.*, APR8/D, Rev. 1, (1990),1-71.

PLAY-HOOKEY.COM, "The Integrator", http://www.play-hookey.com/analog/integrators.html, (Copyright © 1996, 2000-2004),1-2.

Robinson, Travis , et al., "A Successive Approximation ADC", http://www.ece.ualberta.ca/~elliott/ee552/studentAppNotes/2000_w/cad/Successive_ Appr_ ADC/Suc_ app_ADC.htm, An overview of a winter 2000 EE 570 Supplementary Lecture by Angela Antoniu,(Winter 2000),1-4.

* cited by examiner

LOW POWER SIGMA DELTA MODULATOR WITH SUCCESSIVE APPROXIMATION CONVERTER

RELATED APPLICATION

This application is a continuation under 37 C.F.R. 1.53(b) of U.S. patent application Ser. No. 11/132,705 filed May 19, 2005, now U.S. Pat. No. 7,142,144 which application is incorporated herein by reference.

FIELD OF INVENTION

The present disclosure relates to analog-to-digital channels, and in particular, to low power sigma-delta modulation.

BACKGROUND

Signals may be defined as a physical quantity, such as sound or voltage, which vary with respect to time, space or some other variable. These signals may include information wherein the information is represented by the variations in the signal. For example, the human voice or music are signals that included information based on variations in the amplitude and frequency of sound waves. It is often useful to convert a signal such as a human voice or music into an electronic signal where one or more processes can then be performed on the signal. For example, sounds such as a human voice can be converted to an electronic signal in a device such as a hearing aid. In the hearing aid example, the voice of the person speaking is converted into an analog electronic signal by a device such as a microphone. Once the hearing aid has converted the sound to an analog electronic signal, the signal can be processed to amplify one or more portions of the signal, and then converted back into sound by a speaker or other output device. The processing of the signal in the hearing aid example allows the person using the hearing aid to better hear the sounds.

In the processing of electronic signals, it is often helpful or necessary to convert the analog electronic signal into a digital signal. Digital signals allow the signals to be processed by digital signal processing systems, including systems incorporating digital computers and microprocessors. In order for an analog electronic signal to be processed by a digital signal processing system, the analog electronic signal is converted to a digital signal. This can be accomplished using an analog-to-digital converter. The analog-to-digital converter takes samples of one or more characteristics of the analog electronic signal at certain time intervals, and converts each sample into a digital representation of a value or values of the one or more characteristics of the sample. A series of these samples, taken at a fast enough sampling rate, will result in a digital representation of the analog signal.

One problem faced when performing analog-to-digital signal conversion is aliasing. Aliasing occurs when frequencies not present in the original analog electronic signal could be represented by the digital representation produced by the analog-to-digital conversion. The ability of an analog-to-digital converter to remove or at least attenuate the unwanted aliasing is referred to as image rejection, and is measured in decibels.

In addition, performing analog-to-digital signal conversions using low power is desirable in various devices, for example, devices powered from batteries where battery life and time between battery recharging are important criteria.

There is a need in the art for a system and a method for converting an analog electronic signal to a digital signal having a low power requirement, being compact, and yet being capable of operating over the required frequency range while achieving the required amount of image rejection.

SUMMARY

The above-mentioned problems and others not expressly discussed herein are addressed by the present subject matter and will be understood by reading and studying this specification.

Various aspects of the present subject matter include a device comprising a decimation filter including an output and a sigma-delta modulator coupled to the output of the decimation filter. In various embodiments, a clock frequency applied to the decimation filter is approximately a integral multiple of a sampling frequency of the sigma delta modulator. In various embodiments, the decimation filter is a switched capacitor decimation filter. In various embodiments, the decimation filter places a null in one or more signals received by the sigma-delta modulator at a sampling frequency of the sigma-delta modulator. Various embodiments include operating the decimation filter at a clock frequency that is four times higher than a sampling frequency of the sigma-delta modulator.

In various embodiments, the sigma-delta modulator and the decimation filter are included in one or more integrated circuits. In varying embodiments, a device comprising a sigma-delta modulator includes at least one successive approximation converter. In various examples, the at least one successive approximation converter runs at approximately six times a sampling frequency of the sigma-delta modulator. In various embodiments, the one or more successive approximation converters includes at least one 5-bit converter. In various embodiments, the one or more successive approximation converters include at least one 4-bit converter. In varying embodiments, the sigma-delta modulator is a fourth order cascaded modulator. In various embodiments, a first stage of the fourth order cascaded modulator includes a 5-bit converter, a second stage of the fourth order cascaded modulator includes a 4-bit successive approximation converter, and a third stage of the fourth order cascaded modulator includes a 4-bit successive approximation converter.

Embodiments of present subject matter include a device comprising a means for filtering an analog input signal including an output; and a sigma-delta modulator coupled to the output of the means for filtering the analog input signal where a clock frequency applied to the means for filtering is approximately a integer multiple of a sampling frequency of the sigma delta modulator.

Various aspects of the present subject matter include a method comprising filtering an analog signal using a decimation filter to produce a filtered signal. The method, in various examples, includes applying the filtered signal to an input of a sigma-delta modulator and producing an output from the sigma-delta modulator. Embodiments of the method include sampling the analog signal at a rate that is 16 times the frequency of the highest frequency present in the analog signal. Embodiments also include operating the decimation filter at a clock speed that is a multiple of the sampling rate so that the filtered signal includes a null at approximately a sampling frequency of the analog signal.

This Summary is an overview of some of the teachings of the present application and is not intended to be an exclusive or exhaustive treatment of the present subject matter. Further details about the present subject matter are found in the detailed description and appended claims. Other aspects will be apparent to persons skilled in the art upon reading and understanding the following detailed description and viewing the drawings that form a part thereof, each of which are not to be taken in a limiting sense. The scope of the present invention is defined by the appended claims and their legal equivalents.

BRIEF DESCRIPTION OF THE DRAWINGS

A more complete understanding of the invention and its various features, objects and advantages may be obtained from a consideration of the following detailed description, the appended claims, and the attached drawings in which:

DETAILED DESCRIPTION

The following detailed description refers to subject matter in the accompanying drawings which demonstrate some examples of specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references may contemplate more than one embodiment. The following detailed description is, therefore, not to be taken in a limiting sense, and the scope is defined only by the appended claims, along with the full scope of legal equivalents to which such claims are entitled.

In many devices, both power consumption and reducing the overall size of the device are very important. For example, in devices such as electronic hearing aids, which are powered from batteries, battery life is an important issue. Lower power consumption by the electronic circuits in the hearing aid result in a longer times between needed recharging sessions of the battery, and results in longer batter life due to the reduced number of recharging cycles the battery is exposed to. In addition, making hearing aids small in size is also very important. Since the user often wears the hearing aid in or near their ear or ears, a smaller size device results in more comfort for the user, and a device which is less conspicuous to others.

In addition, the frequency ranges of the signals in some applications is relatively low. Therefore, an analog-to-digital converter capable of operating at a relatively low frequency may be adequate. For example, audio frequencies associated with human hearing are generally below a frequency of approximately 16 khertz. An analog-to-digital converter used to convert signals in the frequency range of human hearing may be required to convert signals with a maximum frequency component of approximately 16 khertz. Depending on the type of analog-to-digital converter used, the circuits of the converter may be required to operate up to some integral multiple of this maximum frequency.

Figure 1:
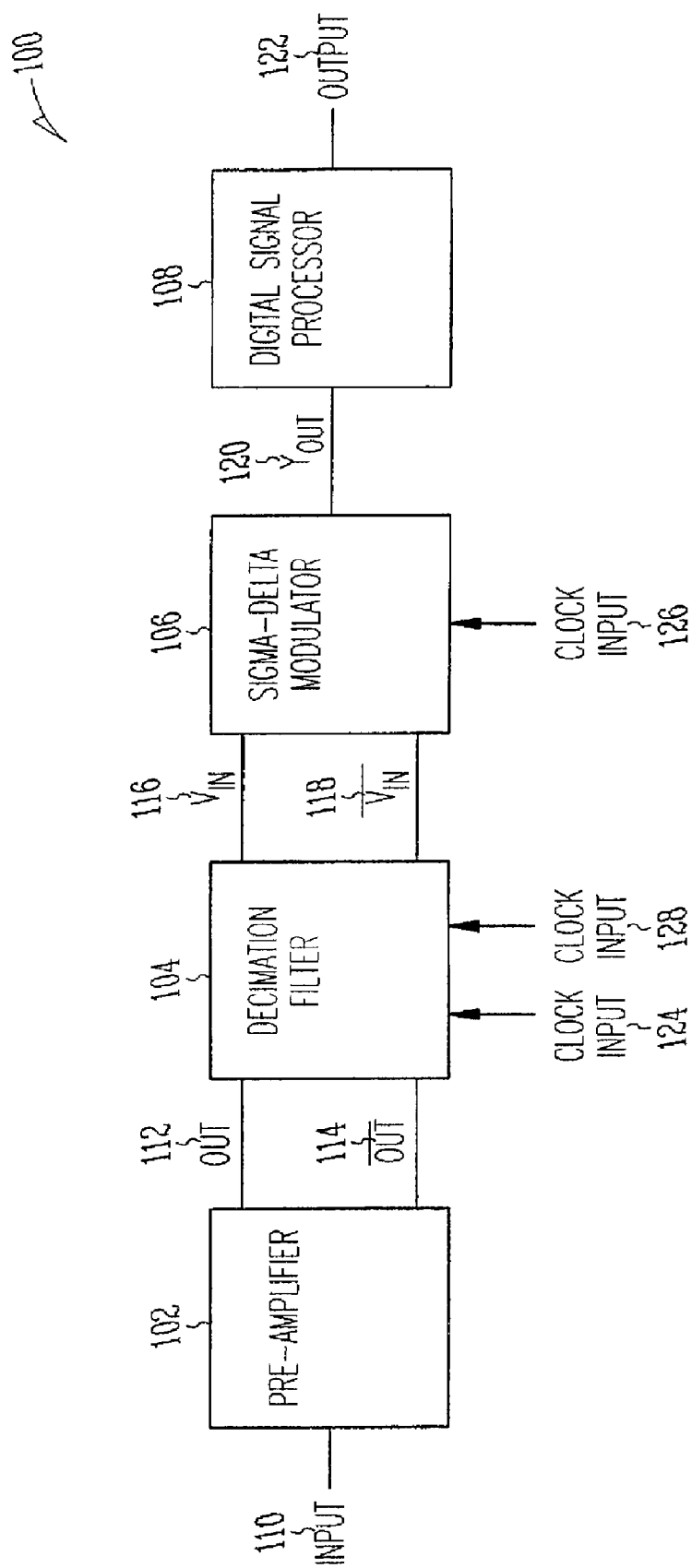
FIG. 1 shows a block diagram of an embodiment of the present invention.

In the embodiment illustrated in FIG. 1, the signal processing channel 100 includes a decimation filter 104 and a sigma-delta modulator 106. Decimation filter 104 performs filtering of an input signal before the signal is applied to sigma-delta modulator 106. A sigma-delta modulator is an oversampling converter, and therefore does not require the complex and high performance filtering required when using a Nyquist type converter. However, the application of some filtering of the analog signal before applying the signal to the sigma-delta modulator allows the sigma-delta modulator to operate at a much lower sampling frequency, while still meeting the requirement for a given level of image rejection.

Use of a minimum sampling rate for the oversampling converter reduces the power requirements needed to perform the conversion in the sigma-delta modulator 106. In addition, the lower frequency sampling rate allows the use of certain types of circuits, for example successive approximation comparators, that also require less power. Thus, the overall power requirements needed to perform the analog-to-digital conversion are further reduced. These low power circuits may not be suitable for use if higher frequency sample rates are required, because of the frequency or speed limitations of these circuits.

In an embodiment as illustrated in FIG. 1, an input signal 110 is received by a preamplifier 102. The preamplifier produces signal 112 that is coupled to decimation filter 104. In an embodiment, preamplifier 102 produces a differential output signal including signals 112 and 114. Decimation filter 104 receives signal 112, and signal 114 if provided, and filters the signal or signals to produce a filtered signal 116. In an embodiment, the decimation filter 104 produces a filtered differential signal including 116 and 118. In an embodiment, the filtered signal 116, including signal 118 if provided, are filtered analog signals. Sigma-delta modulator 106 receives the filtered signals 116, and also signal 118 if provided, and produces signal Yout 120. In an embodiment, signal Yout 120 is a binary output. In an embodiment, signal Yout 120 is a 10 bit signed binary output. In an embodiment, signal Yout 120 is a signed binary output where one or more of the output bits is a sign bit. It will be recognized that a variety of other binary outputs may be generated at signal Yout 120. Signal Yout 120 may further be received by digital signal processor 108. Digital signal processor 108 receives signal Yout 120 and produces output signal 122. In an embodiment, output signal 122 is a binary output in a two's compliment format. It will be realized that a variety of other binary outputs may be generated at output signal 122.

In an embodiment, filtering of the analog signal to be converted to a digital signal can be achieved using a decimation filter. By operating the decimation filter at a frequency that is at a particular integer multiple of the sampling frequency of the sigma-delta modulator, the output from the decimation filter will have a null placed at the sampling frequency which is then applied as an input to the sigma-delta modulator. This results in the conversion of the filtered signal producing an image frequency that is shifted far enough from the base band that a hard to achieve image rejection requirement can still be met despite the lower sampling frequency of the sigma-delta modulator.

In FIG. 1, decimation filter 104 receives clock inputs 124 and 128. The sigma-delta modulator 106 receives clock input 126. In an embodiment, clock input 126 to the sigma-delta modulator operates at a frequency that is 16 times higher than the highest frequency to be converted in the input signal 110. In other words, the ratio of the clock frequency at clock input 126 (the sampling frequency) to the Nyquist number, defined as approximately twice the frequency of the highest frequency in the signal to be converted, is eight. In applications where the input signal represents signals having frequencies in the range of human hearing, for example, in a hearing aid application, the input signal 110 may be limited to frequencies below approximately 16 kilohertz. In such an application, the Nyquist number would be 32 kilohertz. Using a sampling frequency to Nyquist number ratio of eight, a clock frequency of 256 kilohertz is applied to sigma delta modulator 106, and a clock frequency four times that, or 1.024 megahertz, is applied to decimation filter 104. As a result, decimation filter 104 will place a null frequency at the input to sigma-delta modulator 106 at 256 kilohertz. Image frequencies generated by the sigma-delta modulator will be at frequencies high enough to meet an image rejection specification calling for greater than 55 decibels of rejection.

Figure 2:
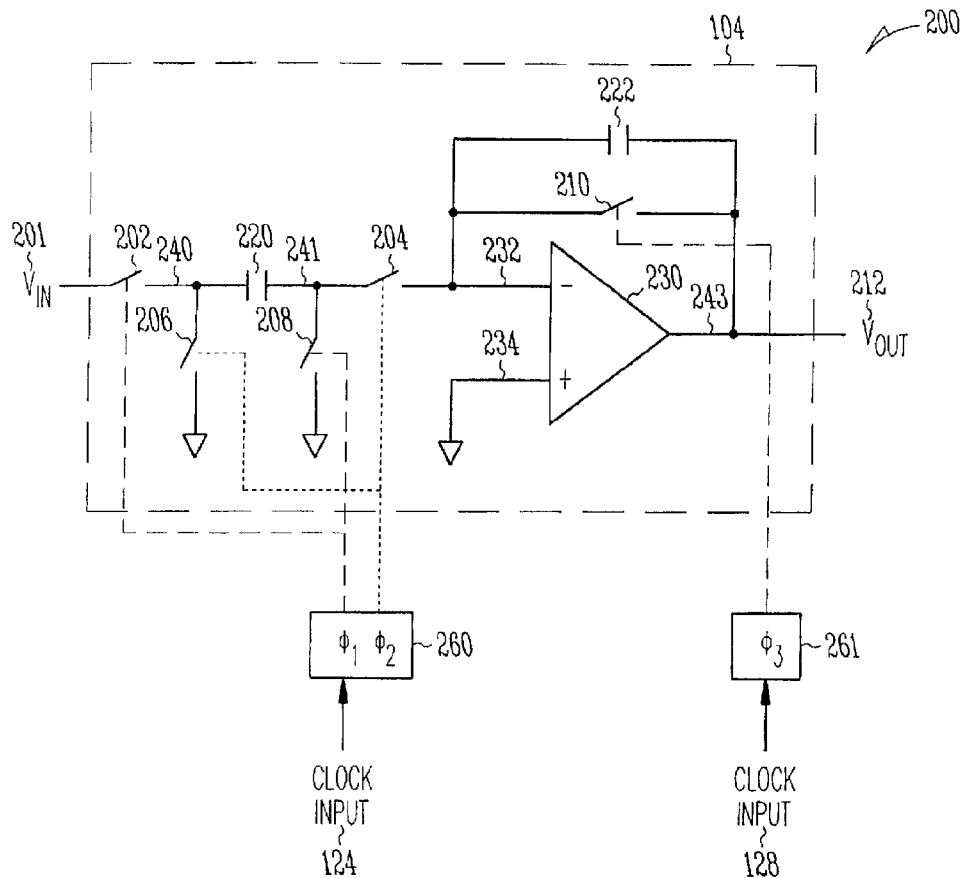
FIG. 2 is a particular implementation of circuitry for a switched capacitor decimation filter according to an embodiment of the present invention.

FIG. 2 illustrates a decimation filter 200. In various embodiments, decimation filter 200 is the decimation filter 104 of FIG. 1. Decimation filter 200 is a switched capacitor decimation filter, including amplifier 230 and capacitors 220 and 222. In an embodiment, amplifier 230 is an operational amplifier, or op-amp. Capacitors 220 and 222 can be various types of capacitors, including but not limited to, integrated metal capacitors. In an embodiment, capacitors 220 and 222 are formed as part of an integrated circuit. Decimation filter 200 also includes switches 202, 204, 206, 208, and 210. Switches 202, 204, 206, 208, and 210 may be various types of switches, including but not limited to solid state switches. In an embodiment, switches 202, 204, 206, 208, and 210 are formed as part of an integrated circuit. In an embodiment, switches 202, 204, 206, and 208 are switched between an open or off condition and a closed or on condition by clock signal 124. In an embodiment, clock signal 124 includes phase signals 260. In an embodiment, switch 210 is switched between an open or off condition and a closed or on condition by clock signal 128. In an embodiment, clock signal 128 is the same signal as clock signal 126 supplied to sigma-delta modulator 106, but including a different duty cycle. In an embodiment, clock signal 128 includes phase signal 261. In an embodiment, switches 202 and 208 are switched between the on and off condition by the $\Phi 1$ portion of phase signals 260, switches 204 and 206 are switched between the on and off condition by the $\Phi 2$ portion of phase signals 260, and switch 210 is switched between the on and off condition by the $\Phi 3$ portion of phase signal 261.

Figure 3:
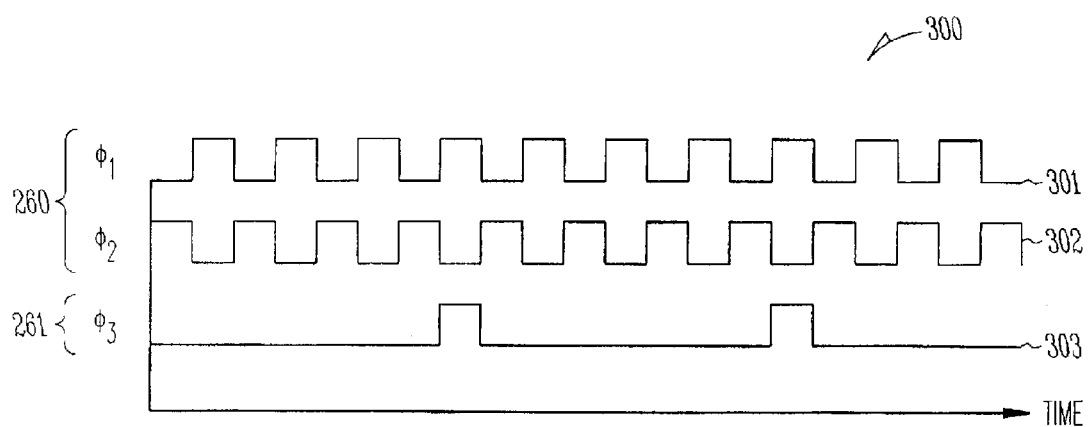
FIG. 3 shows an example set of waveforms according to an embodiment of the present invention.

FIG. 3 illustrates an embodiment of a set of waveforms 300 applied to the decimation filter 200 of FIG. 2. In an embodiment, waveforms 301 and 302 are portions of phase signal 260, and waveform 303 is a portion of phase signal 261. Waveform 301 includes a symmetrical square wave $\Phi 1$, the waveform alternating between a high level and a low level at a frequency. In an embodiment, the frequency of waveform 301 is 1.024 megahertz. Waveform 302 includes a symmetrical square wave $\Phi 2$, the waveform alternating between a high level and a low level at the same frequency as waveform 301. Waveform 302 alternates between a high and a low state in a manner so that waveform 302 is approximately one hundred eighty degrees out of phase with waveform 301. Waveform 303 is a non-symmetrical square wave $\Phi 3$, alternating between a high level and a low level at a frequency. In an embodiment, the frequency of waveform 303 is one fourth the frequency of waveforms 301 and 302. In an embodiment, waveform 303 has a frequency of 256 kilohertz. Waveform 303 remains in the low state, and switches to the high state at the time and for the duration that matches every fourth transition of waveform 301 from the low to the high state returning to the low state.

Returning to FIG. 2, the frequency behavior of decimation filter 200 can be changed by either changing the capacitor size or by changing the clock frequency. In an embodiment, the capacitor size for capacitor 220 and 222 are fixed, and the frequency behavior of decimation filter 200 is determined by the frequency of clock input 124. In an embodiment, the frequency of clock input 124 is an integral multiple of the sampling frequency of the sigma delta modulator 106. In an embodiment, the frequency of clock input 124 is four times the sampling frequency of sigma-delta modulator 106. In an embodiment, during a certain time period, $\Phi 1$ is in a high state, and $\Phi 2$ and $\Phi 3$ are in a low state. During this time, switches 202 and 208 will be closed and switches 204, 206, and 210 will be open. During this time, input signal Vin 201 will be coupled to a first terminal of capacitor 220 through switch 202 and node 240. The second terminal of capacitor 220 is connected to node 241 and is coupled to ground through switch 208.

During a different time period, $\Phi 1$ and $\Phi 3$ are in a low state, and $\Phi 2$ is in a high state. During this time, switches 202, 208, and 210 will be open and switches 204 and 206 will be closed. During this time, input signal Vin 201 will not be coupled to capacitor 220 through switch 202, and the first terminal of capacitor 220 coupled to node 240 will be coupled to ground through switch 206. The second terminal of capacitor 220 is connected to node 241 and will be coupled to the inverting input of amplifier 230 though node 232. A first terminal of capacitor 222 is also coupled to node 232. The second terminal of capacitor 222 is coupled to the output of amplifier 230 through node 243. The non-inverting input of amplifier 230 is coupled to ground through node 234.

During a still different time, $\Phi 1$ and $\Phi 3$ are in a high state, and $\Phi 2$ is in a low state. During this time, switches 202, 208, and 210 will be closed and switches 204 and 206 will be open. During this time, input signal Vin 201 will be coupled to a first terminal of capacitor 220 through switch 202 and node 240. The second terminal of capacitor 220 is connected to node 241 and is coupled to ground through switch 208. However, because switch 204 is open, capacitor 220 is not coupled to the inverting input of amplifier 230. The first terminal of capacitor 222 is coupled to node 232, and the second terminal of capacitor 222 is coupled to the output of amplifier 230 at node 243. In addition, the inverting input of amplifier 230 will be coupled to the output of amplifier 230 through switch 210. Therefore, during this time period, the voltage present at the non-inverting input of amplifier 230 will appear as Vout 212 at node 243. The non-inverting input of amplifier 230 is coupled to ground through node 234.

Figure 4:
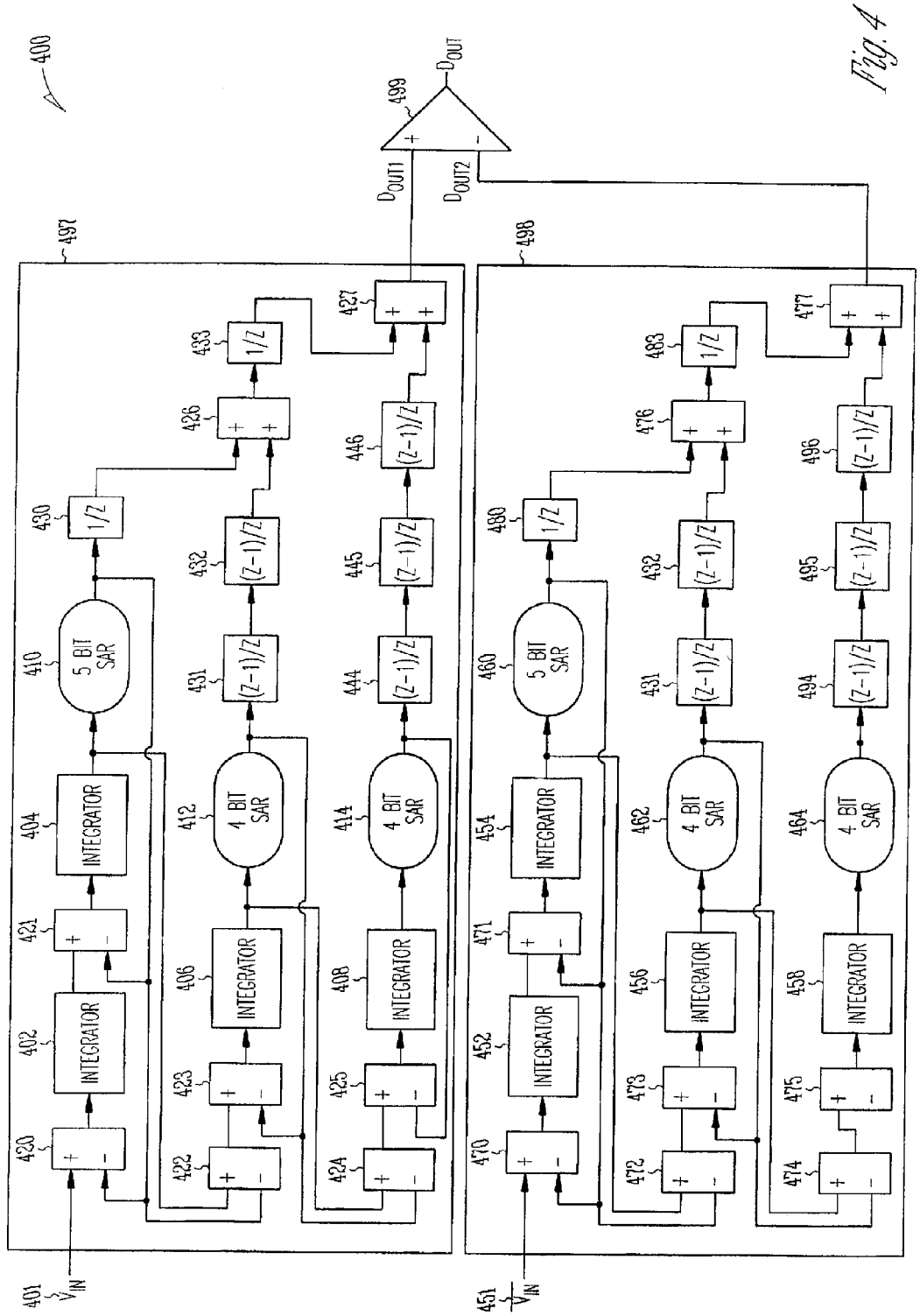
FIG. 4 shows a schematic view of a sigma-delta modulator according to an embodiment of the present invention.

FIG. 4 is an illustration of a sigma-delta modulator 400. In various embodiments, sigma-delta modulator 400 is the sigma-delta modulator 106 of FIG. 1. Sigma-delta modulators convert an analog input signal to a digital output, the digital output being a representation of the analog input signal. A sigma-delta modulator operates by quantizing the change in the analog input signal from one sample to the next, as opposed to quantifying an absolute value for the signal. Sigma-delta modulators incorporate integrators which acts as a predictor. The integrator tries to predict the next input signal level. The difference between the predicted next signal level and the actual signal level is the predicted error term. The predicted error term is quantized and used to make the next prediction. Sigma-delta modulators incorporate a converter to encode the integral of the signal from the integrator. The output of the sigma-delta modulator may be a 1-bit digital output stream that is received by a digital decimation filter. One advantage of the sigma-delta modulator is that their performance is not sensitive to the rate of change of the analog input signal.

In some embodiments, the sigma-delta modulator includes cascaded stages, where each stage include one or more integrators and a comparator. In a cascaded sigma-delta modulator, the output from one stage is received as an input to one or more other stages. In an embodiment, each of the cascaded stages of the sigma-delta modulator has a gain. The gain for each of the stages may or may not be the same as the gain for another stage. The outputs at the stages are combined to produce a binary output. In an embodiment, the output is a stream of binary bits. In an embodiment, the output is a 10 bit signed binary output. In an embodiment, the sigma-delta modulator includes a second cascaded sigma-delta modulator, where the first sigma-delta modulator receives one portion of a differential analog input signal, and the second cascaded stage sigma-delta modulator receives the differential signal portion of the analog input signal. The output signals of the first and second sigma-delta modulators are combined to produce an binary output signal.

FIG. 4 illustrates the sigma delta modulator 400 including a first cascaded sigma-delta modulator 497 and a second cascaded sigma-delta modulator 498, including successive approximation converters. In an embodiment, sigma-delta modulator 400 includes clock input 126, as shown in FIG. 2. In an embodiment, the successive approximation converters of the sigma delta modulator operate at a clock speed of approximately six time the sigma-delta modulator clock speed.

An input signal 401 is received by the first sigma-delta modulator 497 at summer 420. The first sigma-delta modulator produces an binary output Dout1 at summer 427. A differential signal, Vin (bar), corresponding to Vin is received by the second sigma-delta modulator 498 at summer 470. The second sigma-delta modulator produces a binary output Dout2 at summer 477. The output signals Dout1 is applied to the non-inverting input of adder 499 and the output signal Dout2 is applied to the inverting input of adder 499 to produce the output signal Dout. In an embodiment, Dout is a 10 bit signed binary output, where the most significant bit is a sign bit. Other output formats for Dout are possible, including but not limited to, a output in a two's compliment format.

In the embodiment of FIG. 4, the first sigma-delta modulator 497 is a fourth order cascaded sigma-delta modulator including successive approximation converters. The second sigma-delta modulator 498 in the embodiment of FIG. 4 is identical to the first sigma-delta modulator 497 except that the second sigma-delta modulator 498 processes the Vin(bar) signal, and the output from the second sigma-delta modulator 498 is coupled to the inverting input of adder 499. Therefore, only the first sigma-delta modulator 497 will be described in detail. However, except as noted, the devices and functions of the first sigma-delta modulator 497 are also found in the second sigma-delta modulator 498.

The first cascaded sigma-delta modulator includes three stages. The first stage includes two integrators and a 5-bit successive approximation converter. Input signal 401 is coupled to a first input of summer 420. The output signal from 5-bit successive approximation comparator 410 is coupled to a second input of summer 420. The output of summer 420 is coupled to the input of integrator 402. The output of integrator 402 is coupled to an input of summer 421. The output signal from 5-bit successive approximation comparator 410 is coupled to a second input of summer 421. The output of summer 421 is coupled to integrator 404. The output of integrator 404 is coupled to an input of 5-bit successive approximation converter 410. The output of 5-bit successive approximation converter 410 is a 5-bit binary value. In one embodiment, the gain of the first stage of the first cascaded sigma-delta modulator 497 is one. The output from 5-bit successive approximation converter 410 is coupled to delay 430.

Various embodiments of sigma-delta modulator 106 and 400 are not limited to the use of a 5-bit successive approximation converter, or to the use of a 4-bit successive approximation converter. It will be recognized that different considerations are used in the determination of the bit resolution chosen for the one or more successive approximation converters used. In an embodiment, the bit resolution of one or more of the successive approximation converters is chosen based on a signal to quantization specification being greater than a particular value, for example, 100 decibels. In an embodiment, the output swing of the integrator is a consideration in choosing the bit resolution of one or more of the successive approximation converters. In an embodiment, voltage headroom is a consideration in choosing the bit resolution of one or more successive approximation converters. Other factors may be used in choosing the bit resolution of one or more of the successive approximation converters without limiting the scope of the present invention.

Returning to FIG. 4, the output from 5-bit successive approximation converter 410 is also coupled to input of summer 422, which thereby introduces the output signal from the first stage to the second stage of the first cascaded sigma-delta modulator 497. In addition, the output from integrator 404 is coupled to an input of summer 422.

The output of summer 422 is coupled to an input of summer 423. The output signal from 4-bit successive approximation converter 412 is also coupled to an input of summer 423. The output from summer 423 is coupled to integrator 406. The output of integrator 406 is coupled to 4-bit successive approximation converter 412. The output of 4-bit successive approximation converter 412 is a 4 bit binary value. In one embodiment, the gain of the second stage of the first cascaded sigma-delta modulator 497 is four. The output from 4-bit successive approximation converter 412 is coupled to differentiator 431. The output of differentiator 431 is coupled to an input of differentiator 432.

The output from 4-bit successive approximation converter 412 is also coupled to an input of summer 424, which thereby introduces the output signal from the second stage to the third stage of the first cascaded sigma-delta modulator 497. In addition, the output from integrator 406 is coupled to an input of summer 424.

The output of summer 424 is coupled to an input of summer 425. The output signal from 4-bit successive approximation converter 414 is also coupled to an input of summer 425. The output from summer 425 is coupled to integrator 408. The output of integrator 408 is coupled to 4-bit successive approximation converter 414. The output of 4-bit successive approximation converter 414 is a 4 bit binary value. In one embodiment, the gain of the third stage of the first cascaded sigma-delta modulator 497 is eight. The output from 4-bit successive approximation converter 414 is coupled to differentiator 444. The output of differentiator 444 is coupled to an input of differentiator 445. The output of differentiator 445 is coupled to an input of differentiator 446.

In combining the outputs of each of the stages of the first cascaded sigma-delta modulator 497, the first stage output from differentiator 430 is coupled to an input of summer 426. The second stage output from differentiator 432 is coupled to a second input of summer 426. The output of differentiator 426 is coupled to an input of delay 433, and the output of delay 433 is coupled to an input of summer 427. The third stage output from differentiator 446 is coupled to a second input of summer 427. Summer 427 outputs the Dout1 signal, which is the output signal from the first cascaded sigma-delta modulator 497. As noted above, the Dout1 signal may be combined with the Dout2 signal from the second cascaded sigma-delta modulator 498 in adder 499 to produce the binary output Dout.

As noted above, sigma delta modulator 400 includes successive approximation converters 410, 412, 414, 460, 462, and 464. It will be recognized that other types of converters may be used with sigma-delta modulators. For example, flash converters may be used. Flash converters operate at high speed, but consume larger amounts of power and require a larger amount of area than some other types of converters. In a single stage sigma-delta modulator where 4 bit linearity is required, the use of flash converters would require a total of $2^4-1$ or 15 comparators, plus a 15 tap resistor string. In a single stage sigma-delta modulator where 5-bit linearity is required, the use of flash converters would require a total of $2^5-1$ or 31 comparators, plus a 31 tap resistor string. In the embodiment illustrated in FIG. 4, utilizing flash converters in the 5-bit converter of the first stage would require 31 comparators with 31 associated tap resistors, and 15 comparators for each of the 4-bit converters in the second and third stages, along with the associated tap resistors, for a total of 61 comparators with 61 associated tap resistors. This circuitry would also need to be duplicated for the first, second, and third stages of second portion of sigma delta modulator 400, specifically, sigma-delta modulator 498 of FIG. 4.

In contrast, using successive approximation converters with the same 5-bit or 4-bit linearity requirement results in the use of a single successive approximation converter for each stage of the sigma-delta modulator. In addition, there is no requirement for tap resistors. In an embodiment, a single successive approximation converter is used for the 5-bit converter 410 of the first stage, and a single successive approximation converter is used in each of the 4-bit converters 412, 414 of the second and third stages of the sigma-delta modulator, for a total of 3 successive approximation converters. In addition, there is no requirement for any tap resistors in the embodiments using successive approximation converters. This results in reduced circuitry, and therefore a smaller device.

In addition, the use of successive approximation converters as compared to flash converters results in a reduced power requirement needed to operate a sigma-delta converter, resulting in an overall reduced power requirement for performing the analog-to-digital conversion. In an embodiment, the use of successive approximation converters allows implementation of the first cascaded sigma-delta modulator 497 using only three successive approximation converters, and does not require the use of tap resistors. In an embodiment, the current required to run the three successive approximation converters is approximately 10 microamperes or less at approximately 1.25 volts, where each successive approximation converter draws approximately 3 microamperes. In contrast, using flash converters and their associated resistor strings would require approximately 42.5 microamperes, based on a requirement of approximately 500 nanoamperes for each of the 61 flash converters (31 for the first stage 5-bit converter, plus 15 each for both the second stage and the third stage 4-bit converters) and approximately 4 microamperes for each of the 61 resistors at the same 1.25 volts. The net result is a savings of approximately 42.5 minus 10, or 32.5 microamperes saved by using the successive approximation converters instead of the flash converters. An equal savings would result by using the successive approximation converter as opposed to flash converters in the other portion of sigma-delta converter 400, namely sigma-delta converter 498.

The capacitive digital-to-analog converter (not shown) for use with the successive approximation converters requires no power. In an embodiment where only 4-bit linearity is required, the matching requirement for the capacitive digital-to-analog converter is very realizable, that is 6.25% at 1 sigma. For example, a 50 femtofarad capacitor in 0.18 process can match to approximately 0.262% at 1 sigma.

Thus, using successive approximation converters instead of flash converters will save significant amounts of power and thus reduce the power requirements needed to operate the analog-to-digital channel. In addition, the reduced number of devices and circuitry need when using successive approximation converters will result in decreased circuit area requirements, and therefore a more compact device. Both these features make the use of successive approximation converters quite attractive for low power applications, including but not limited to, hearing aid applications.

Figure 5:
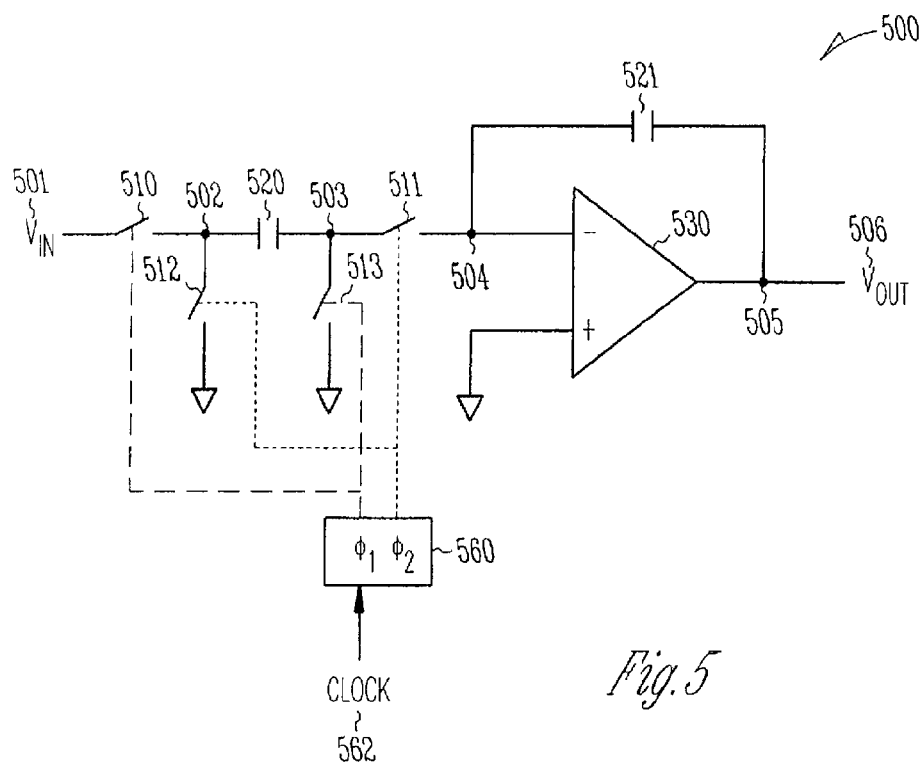
FIG. 5 shows a particular implementation of circuitry for an integrator according to an embodiment of the present invention.

Various embodiments of a sigma-delta modulator include one or more integrators. It will be recognized that various types of integrators may be used. FIG. 5 illustrates an embodiment of an integrator 500 for use in a sigma-delta modulator. In various embodiments, integrator 500 may be included in sigma-delta modulator 106 of FIG. 1. Integrator 500 includes switches 510, 511, 512, and 513, capacitors 520 and 521, and amplifier 530. In an embodiment, switches 510 and 513 are controlled by a clock input 562 which includes phases 560, including $\Phi 1$ and $\Phi 2$. In an embodiment, switches 510 and 513 are switched between an open or off condition and a closed or on condition by $\Phi 1$ of clock input 562, and switches 511 and 512 are switched between an open or off condition and a closed or on condition by $\Phi 2$ of clock input 562. In an embodiment, $\Phi 1$ and $\Phi 2$ are inverse clock signals of each other.

In operation, during one portion of the clock signal switches 510 and 513 are closed, and switches 511 and 512 will be open. During this time, input signal Vinput 501 is coupled to a first terminal of capacitor 520 through switch 510 (node 502). The second terminal of capacitor 520 (node 503) is coupled to ground through switch 513. During this time, capacitor 520 will be charged toward a voltage corresponding to the voltage of input signal 501. During this time, switch 511 is open, and therefore capacitor 521 and amplifier 530 are not connected through node 504 to capacitor 520.

During the next portion of the clock cycle, switches 510 and 513 will open, and switches 511 and 512 will close. During this time, the first terminal of capacitor 520 will be coupled to ground through switch 512. The second terminal of capacitor 520 will be coupled to the inverting input of amplifier 530 and to a first terminal of capacitor 521 through switch 511 and node 504.

During both portions of the clock cycle, the output of amplifier 530 will be coupled to Vout 506 through node 505. In addition, the second terminal of capacitor 521 will be coupled to the output of amplifier 530 at node 505. The non-inverting input of amplifier 530 is coupled to ground.

The gain for integrator 500 is determined by a ratio of the capacitance of capacitor 520 divided by the value of the capacitance of capacitor 521. F-unity equals the ratio of the capacitance of capacitor 520 divided by the value of the capacitance of capacitor 521 multiplied by the clock frequency.

Capacitor 520 is sometimes referred to as the sampling capacitor, while capacitor 521 is referred to as the integration capacitor. The capacitance of the sampling capacitor is determined based on thermal noise considerations. In addition, since the gain of the integrator is determined by the ratio of the sampling capacitor divided by the integration capacitor, for a given gain, once the capacitance of the sampling capacitor is determined, the capacitance of the integrating capacitor is also fixed. It will be recognized that as the capacitance of the sampling and integration capacitor increase, the charging current, and thus the power requirements of the integrator circuit increases. In addition, higher capacitance capacitors require more physical space, and thus consume more area in an circuit, including but not limited to, an integrated circuit.

Figure 6:
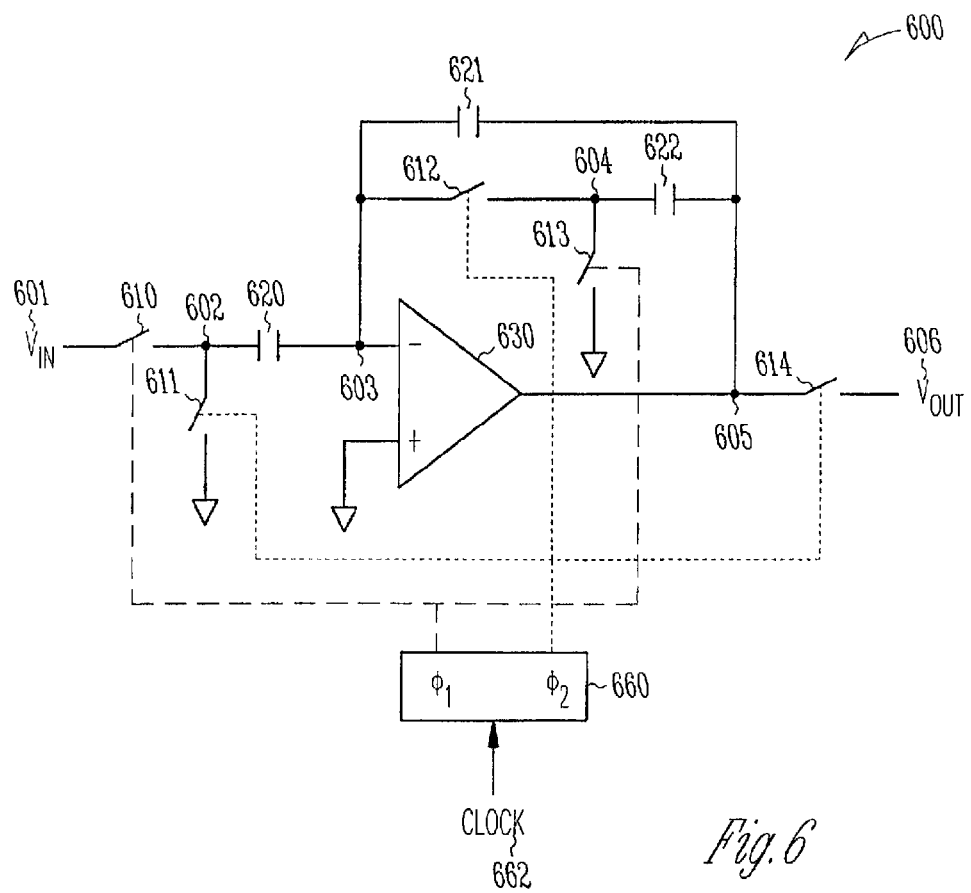
FIG. 6 shows a particular implementation of circuitry for an integrator according to an embodiment of the present invention.

FIG. 6 illustrates an embodiment of an area efficient integrator 600 that may be included in a sigma-delta modulator. In various embodiments, area efficient integrator 600 may be included in sigma-delta modulator 106 of FIG. 1. Area efficient integrator 600 includes switches 610, 611, 612, 613, and 614. Area efficient integrator 600 also includes sampling capacitor 620, integration capacitor 621, extra capacitor 622, and amplifier 630.

In an embodiment, switches 610, 611, 612, 613, and 614 are controlled by a clock input 662 which includes phases 660, including Φ1 and Φ2. In an embodiment, switches 610 and 613 are switched between an open or off condition and a closed or on condition by Φ1 of clock input 662, and switches 611, 612, are 614 are switched between an open or off condition and a closed or on condition by Φ2 of clock input 662. In an embodiment Φ1 and Φ2 are inverse clock signals of each other.

In operation, during one portion of the clock input, switches 610 and 613 are closed, and switches 611, 612, and 614 will be open. During this time, input signal Vin 601 is coupled to a first terminal of capacitor 620 through switch 610 and node 602. The second terminal of capacitor 620 is coupled to the inverting input of amplifier 630. The non-inverting input of amplifier 630 is coupled to ground. A first terminal of capacitor 621 is also coupled to the inverting input of amplifier 630 through node 603. The second terminal of capacitor 621 is coupled to a first terminal of capacitor 622 and to the output of amplifier 630 at node 605. The second terminal of capacitor 622 is coupled to ground through switch 613. Switch 614 is open, thus disconnecting node 605 from Vout 606.

During the next portion of the clock cycle, switches 610 and 613 will open, and switches 611, 612, and 614 will close. During this time, the first terminal of capacitor 620 will be coupled to ground through node 602 and switch 611. The second terminal of capacitor 620 will be coupled to the inverting input of amplifier 630 and to the first terminal of capacitor 621 through node 603. The non-inverting input to amplifier 630 remains coupled to ground. The second terminal of capacitor 621 will be coupled to the first terminal of capacitor 622 and to the output of amplifier 630 at node 605. The second terminal of capacitor 622 is coupled through switch 612 to the first terminal of capacitor 621 and the second terminal of capacitor 620 at node 603. Switch 613 is open, thus disconnecting node 604 from ground. Switch 614 is closed, thus coupling node 605 to Vout 606.

The gain for area efficient integrator 600 is calculated using the formula:

$$\frac{Cext \cdot Cs \cdot Cint}{(Cint + Cext) \cdot (Cint \cdot Cint)}$$

Where Cext is the capacitance of extra capacitor 622, Cs is the capacitance of sampling capacitor 620, and Cint is the capacitance of the integrating capacitor 621.

By way of example, for a typical integrator where the required gain is 0.5 and a sampling capacitor having a capacitance of 0.9 picoFarads is selected, an integrating capacitor with a capacitance of 1.8 picoFarads would be required, resulting in an overall capacitance of 2.7 picoFarads. For the area efficient integrator requiring the same gain of 0.5 and using the same size sampling capacitor of 0.9 picoFarads, an integration capacitor of only 0.6 picoFarads with an extra capacitor of 0.3 picoFarads can be used, where the overall capacitance is 1.8 picoFarads. In this example, the total capacitance of the area efficient integrator is 0.9 picoFarads less than that of the typical integrator, a 50 percent savings in the area required for capacitors in the circuit.

Again by way of example, the equivalent load capacitance during the integration of a typical integrator is calculated using the formula:

$$Cload\_Equivalent = Cload + (1 - Cinteg/(Cinteg + Csample + Cparasitic) * Cinteg)$$

where Cload Equivalent is the equivalent load capacitance during integration, Cload is the load capacitance, Csample is the capacitance of the sampling capacitor, Cinteg is the capacitance of the integrating capacitor, and Cparasitic is a value of the parasitic capacitance. Using the formula and substituting the following values:
Csample=0.9 pF
Cinteg=1.8 pF,
Cload=0.9 pF,
Cparasitic=0.09 pF results in an equivalent load capacitance during integration of 1.539 picoFarads. In contrast, equivalent load capacitance during integration of the area efficient integration is calculated using the formula:

$$Cload\_Equivalent = Cload + (1 - Cinteg/(Cinteg + Csample + Cparasitic) * Cinteg)$$

where Cload Equivalent is the equivalent load capacitance during integration, Cload is the load capacitance, Csample is the capacitance of the sampling capacitor, Cinteg is the capacitance of the integrating capacitor, Cextra is the capacitance of the extra capacitor, and Cparasitic is a value of the parasitic capacitance. Using this formula and substituting the following values:
Csample=0.9 pF
Cinteg=0.6 pF
Cextra=0.3 pF
Cload=0.9 pF
Cparasitic=0.09 pF results in an equivalent load capacitance during integration of 1.274 picoFarads.

Thus, in this example the load capacitance reduction due to the use of the area efficient integrators instead of the typical integrators is 1.539 picoFarads divided by 1.274 picoFarads, or 1.21, representing a 21 percent reduction in the equivalent load capacitive of the area efficient integrator over the typical integrator during integration. The reduced equivalent load capacitance translates into a lesser charging current supplied from the amplifier, resulting in an overall reduction of the power requirements of the circuit.

It will be recognized that for a given required gain, and for a given capacitance for the sampling capacitor, the combined required capacitance for the integrating capacitor and the extra capacitor is approximately 50 percent less than the capacitance required by a typical integrator, such as integrator 500 of FIG. 5. The reduced overall capacitance of the area efficient integrator results in an overall reduction in the space requirement for the circuit. Thus, the area efficient integrator requires less area to construct in an integrated circuit. In addition, the overall lower capacitance of the area efficient integrator reduces the overall load capacitance of the circuit due to the smaller load capacitance during the integration cycle. The result is a lower charging current required to be supplied by the amplifier, resulting in an overall reduction in the power requirements of the circuit.

Using area efficient integrators instead of typical integrators will save significant amounts of power and thus reduce the power requirements needed to operate the analog-to-digital channel. In addition, the reduced area required by the area efficient integrators will result in decreased circuit area, and therefore a more compact device. Both these features make the use of area efficient integrators attractive for low power applications, including but not limited to hearing aid applications.

The area efficient integrator of FIG. 600 has other advantages over a typical switched capacitor integrator. For example, the area efficient integrator is parasitic insensitive. The area efficient integrator also has the capability to perform auto zeroing in order to minimize the amplifier's offset and low frequency 1/f noise. The use of an area efficient integrator in the sigma-delta modulator would include, but is not limited to, the benefits described above.

Figure 7:
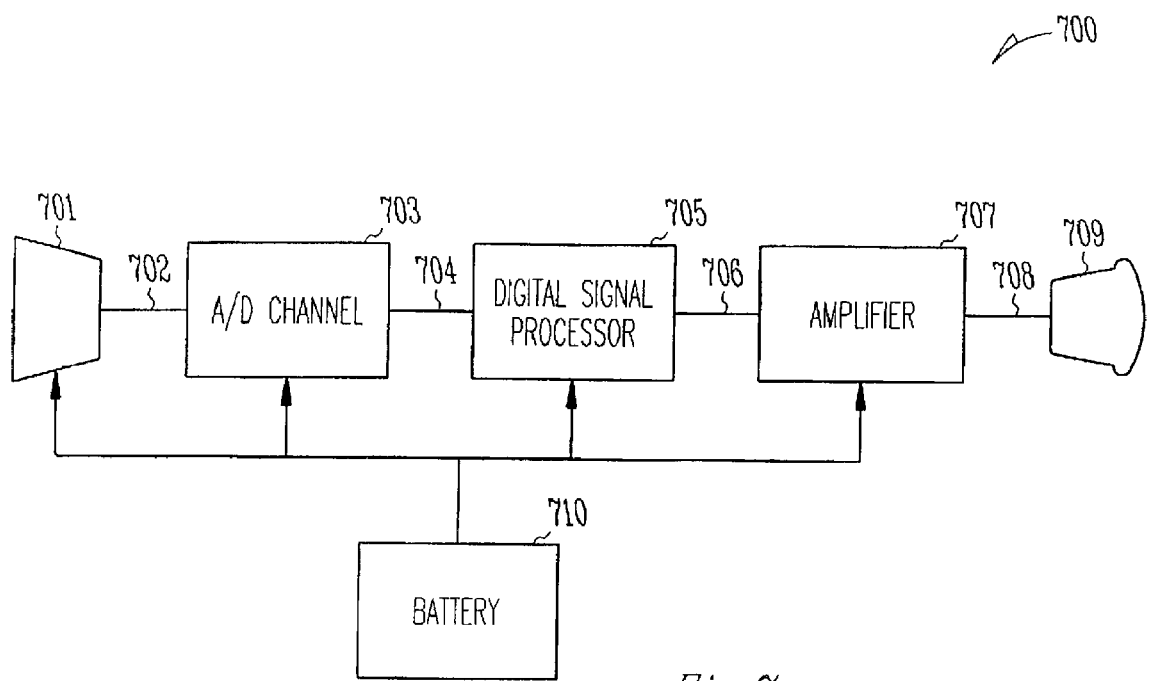
FIG. 7 shows a schematic view of a device according to one or more embodiments of the present invention.

FIG. 7 illustrates an embodiment of a device 700 including an analog-to-digital channel that incorporates one or more features of the present invention. The device 700 may include but is not limited to a hearing aid device. Receiver 701 receives a time varying signal, for example, a sound wave such as a voice or music, and converts the time varying signal to an electrical signal at node 702. In an embodiment, receiver 701 is a microphone, including but not limited to an omnidirectional microphone. In an embodiment, receiver 701 consists of a plurality of microphones, including but not limited to one or more omnidirectional microphones and one or more gradient microphones.

A/D channel 703 receives the electrical signal at node 702. In an embodiment, the electrical signal is an analog electrical signal where some parameter of the signal varies in accordance with the variations of the signal received at receiver 701. A/D channel 703 converts the analog electrical signal into a digital signal at node 704. In an embodiment, A/D channel 703 includes a decimation filter coupled to a sigma-delta modulator where the decimation filter provides a filtered analog signal to the sigma-delta modulator. In an embodiment, the decimation filter operates at a rate that is an integral multiple of the sampling frequency of the sigma-delta modulator. In an embodiment, the sigma-delta modulator included in A/D channel 703 is a fourth-order cascaded sigma-delta modulator. In various embodiments, the sigma-delta modulator includes one or more area efficient integrators as described above. In various embodiments, the sigma-delta modulator includes successive approximation converters as described above. The digital signal at node 704 includes, but is not limited to, a 10 bit signed binary output. Other digital signals are possible, for example, a digital signal in a two's compliment format.

Digital signal processor 705 receives the digital signal at node 704 and further processes the digital signal to produce an intermediate signal at node 706. Digital signal processor 705 performs one or more processes on the signal received at node 704, including but not limited to, filtering and noise shaping. The intermediate signal at node 706 may be, but is not limited to, an analog signal produced by Digital Signal Processor 705. In an embodiment, amplifier 707 receives the intermediate signal at node 706. Amplifier 707 further processes the intermediate signal, including but not limited to, amplification of the intermediate signal to produce an output signal at node 708. The output signal at node 708 is used to drive output device 709. In an embodiment, output device 709 is a speaker. In an embodiment, output device 709 is a diaphragm and an earpiece designed to provide audible sound to a human ear as part of a hearing aid.

In an embodiment, one or more of the parts of device 700 receive power from battery 710. In an embodiment, battery 710 supplies a voltage of 1.5 Volts. In an embodiment, battery 710 supplies 1.25 volts. It will be realized that a range of voltages may be supplied by battery 710 without limiting the scope of the present subject matter. In an embodiment, battery 710 supplies power to receiver 701, A/D channel 703, digital signal processor 705, amplifier 707. In an embodiment, battery 710 supplies power to output device 709.

In an embodiment, one or more parts of device 700 are included in an integrated circuit. For example, A/D channel 703, digital signal processor 705, and amplifier 707 may be included in an integrated circuit. It will be recognized that other combinations of parts may be included in an integrated circuit, including but not limited to, combinations of two or more integrated circuits incorporating the various parts of device 700.

Those skilled in the art will readily recognize how to realize different embodiments using the novel features of the present invention. Several other embodiments, applications and realizations are possible without departing from the present invention. Consequently, the embodiments described herein is not intended in an exclusive or limiting sense, and that the scope of the invention is as claimed in the following claims and their equivalents.

What is claimed is:

1. A device comprising:
a decimation filter including an output; and
a sigma-delta modulator coupled to the output, the sigma-delta modulator including at least one successive approximation converter,
wherein the at least one successive approximation converter runs at approximately six times a sampling frequency of the sigma-delta modulator.

2. The device of claim 1, wherein the at least one successive approximation converter is a 4-bit converter.

3. The device of claim 1, wherein the sigma-delta modulator is a fourth order cascaded modulator.

4. The device of claim 3, wherein a first stage of the fourth order cascaded modulator includes two integrators and has a gain of unity.

5. The device of claim 3, wherein a second stage of the fourth order cascaded modulator includes a single integrator and has a gain of four.

6. The device of claim 3, wherein a third stage of the fourth order cascaded modulator includes a single integrator and has a gain of eight.

7. The device of claim 3, wherein a first stage of the fourth order cascaded modulator includes a 5-bit successive approximation converter, a second stage of the fourth order cascaded modulator includes a 4-bit successive approximation converter, and a third stage of the fourth order cascaded modulator includes a 4-bit successive approximation converter.

8. The device of claim 1, wherein an output of the sigma-delta modulator is a ten bit signed binary output.

9. The device of claim 8, wherein one bit of the ten bit signed binary output is a sign bit.

10. The device of claim 1, wherein using the decimation filter is adapted to operate using a clock frequency of approximately an integral multiple of a sampling frequency of the sigma-delta modulator.

11. A method, comprising:
forming a successive approximation converter;
forming a decimation filter having an output; and
forming a sigma-delta modulator coupled to the output, the sigma-delta modulator including the successive approximation converter,
wherein forming the successive approximation converter includes selecting a bit resolution for the successive approximation converter based on a signal to quantization specification being greater than a particular value.

12. The method of claim 11, further comprising:
forming an integrated circuit including the sigma-delta modulator.

13. The method of claim 12, wherein forming the integrated circuit includes forming the decimation filter.

14. The method of claim 12, further comprising:
forming a hearing assistance device including the integrated circuit.

15. The method of claim 11, wherein selecting the bit resolution for the successive approximation converter includes selecting the bit resolution based on a signal to quantization specification being greater than 100 decibels.

16. The method of claim 11, wherein forming the successive approximation converter includes selecting a bit resolution for the successive approximation converter based on voltage headroom.

17. The method of claim 11, further comprising:
providing a clock frequency to the decimation filter at a frequency of approximately an integral multiple of a sampling frequency of the sigma-delta modulator.

18. A method, comprising:
filtering an analog signal using a decimation filter; and
applying the filtered signal to a sigma-delta modulator including a successive approximation filter,
wherein applying the filtered signal includes applying the signal to the sigma-delta modulator including a successive approximation filter having a bit resolution selected based on voltage headroom.

19. The method of claim 18, wherein using the decimation filter includes providing a clock frequency to the decimation filter at a frequency of approximately an integral multiple of a sampling frequency of the sigma-delta modulator.

20. A device comprising:
a sigma-delta modulator including at least one successive approximation converter,
wherein the at least one successive approximation converter runs at approximately six times a sampling frequency of the sigma-delta modulator.

21. A device comprising:
a sigma-delta modulator including at least one successive approximation converter,
wherein the sigma-delta modulator is a fourth order cascaded modulator, and wherein a second stage of the fourth order cascaded modulator includes a single integrator and has a gain of four.

22. A device comprising:
a sigma-delta modulator including at least one successive approximation converter,
wherein the sigma-delta modulator is a fourth order cascaded modulator, and wherein a third stage of the fourth order cascaded modulator includes a single integrator and has a gain of eight.

23. A device comprising:
a sigma-delta modulator including at least one successive approximation converter,
wherein the sigma-delta modulator is a fourth order cascaded modulator, and wherein a first stage of the fourth order cascaded modulator includes a 5-bit successive approximation converter, a second stage of the fourth order cascaded modulator includes a 4-bit successive approximation converter, and a third stage of the fourth order cascaded modulator includes a 4-bit successive approximation converter.

24. A device comprising:
a sigma-delta modulator including at least one successive approximation converter, wherein an output of the sigma-delta modulator is a ten bit signed binary output.

25. The device of claim 24, wherein one bit of the ten bit signed binary output is a sign bit.

26. A method, comprising:
forming a successive approximation converter; and
forming a sigma-delta modulator including the successive approximation converter,
wherein forming the successive approximation converter includes selecting a bit resolution for the successive approximation converter based on a signal to quantization specification being greater than a particular value.

27. The method of claim 26, wherein selecting the bit resolution for the successive approximation converter includes selecting the bit resolution based on a signal to quantization specification being greater than 100 decibels.

28. A method, comprising:
forming a successive approximation converter; and
forming a sigma-delta modulator including the successive approximation converter,
wherein forming the successive approximation converter includes selecting a bit resolution for the successive approximation converter based on voltage headroom.

* * * * *